(12) United States Patent
Shintani

(10) Patent No.: US 8,854,816 B2
(45) Date of Patent: Oct. 7, 2014

(54) WATER-PROOF COVER FOR AN INVERTER UNIT

(75) Inventor: Takanori Shintani, Suzuka (JP)

(73) Assignee: Fuji Electronic Co., Ltd., Kawasaki-Shi (JP)

( * ) Notice: Subject to any disclaimer, the term of this patent is extended or adjusted under 35 U.S.C. 154(b) by 252 days.

(21) Appl. No.: 13/488,871

(22) Filed: Jun. 5, 2012

(65) Prior Publication Data

US 2012/0327601 A1    Dec. 27, 2012

(30) Foreign Application Priority Data

Jun. 27, 2011    (JP) ................................. 2011-141642

(51) Int. Cl.
  *H05K 7/20*    (2006.01)
  *H05K 7/14*    (2006.01)

(52) U.S. Cl.
  CPC .......... *H05K 7/20909* (2013.01); *H05K 7/1432* (2013.01)
  USPC ........... 361/697; 361/678; 361/695; 361/703; 361/704; 454/184

(58) Field of Classification Search
  USPC ............... 361/676, 678, 679.48–679.49, 690, 361/694–695; 454/184
  See application file for complete search history.

(56) References Cited

U.S. PATENT DOCUMENTS

| | | | | |
|---|---|---|---|---|
| 3,587,908 A | * | 6/1971 | Nickel | 220/4.02 |
| 5,801,331 A | * | 9/1998 | Zachrai | 174/541 |
| 5,832,988 A | * | 11/1998 | Mistry et al. | 165/103 |
| 6,067,223 A | * | 5/2000 | Diebel et al. | 361/676 |
| 6,657,861 B2 | * | 12/2003 | Irmer | 361/695 |
| 6,749,498 B2 | * | 6/2004 | Pfister | 454/184 |
| 7,604,534 B2 | * | 10/2009 | Hill | 454/184 |
| 7,796,376 B2 | * | 9/2010 | Cairo et al. | 361/678 |
| 2010/0247301 A1 | * | 9/2010 | Hatozaki et al. | 415/182.1 |

FOREIGN PATENT DOCUMENTS

| | | | | |
|---|---|---|---|---|
| CN | 201947592 U | * | 8/2011 | H05K 7/20 |
| JP | 2002-151874 | | 5/2002 | |

\* cited by examiner

*Primary Examiner* — Robert J Hoffberg

(74) *Attorney, Agent, or Firm* — Manabu Kanesaka

(57) ABSTRACT

The front case of the unit case contains a circuit section including a power semiconductor module, and the rear case contains a cooling fin assembly of the semiconductor module and a cooling fan. The cooling air ventilated through the wind channel by the cooling fan is discharged upward from the unit case. The water-proof cover is placed over the top of the unit case. The water-proof cover includes an exhausting structure formed with openings downward at the left and right sides of a front part of the water-proof cover to form an exhausting path; and a ventilation guide formed around an exhausting port inside a rear part of the water-proof cover. The cooling air discharged to the inside space of the water-proof cover by the cooling fan is ventilated through the ventilating path and exhausted outside through the exhausting path.

2 Claims, 8 Drawing Sheets

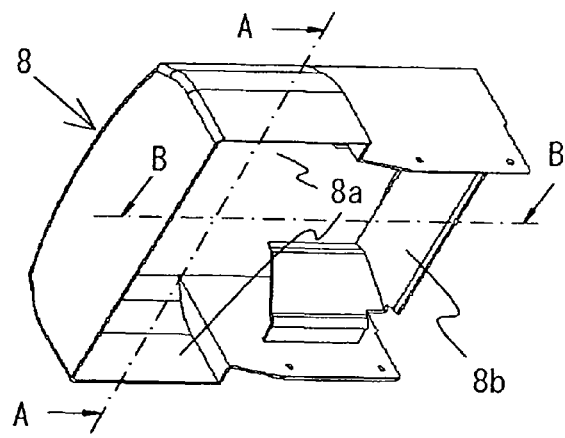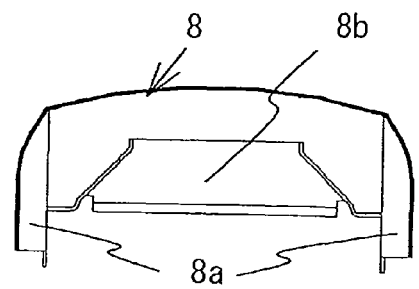
FIG. 4A   FIG. 4B
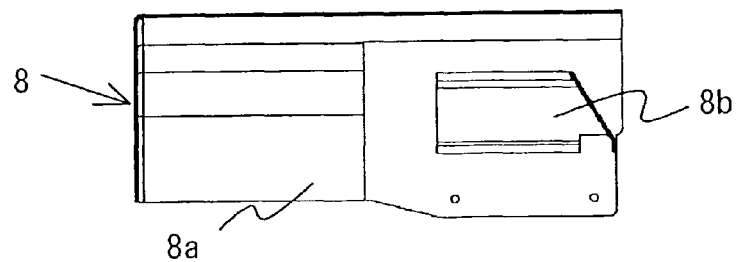
FIG. 4C

WATER-PROOF COVER FOR AN INVERTER UNIT

CROSS-REFERENCE TO RELATED APPLICATION

This application is based on, and claims priority to, Japanese Patent Application No. 2011-141642, filed on Jun. 27, 2011, contents of which are incorporated herein by reference.

BACKGROUND OF THE INVENTION

1. Field of the Invention

The present invention relates to a water-proof cover for an inverter unit and in particular to a water-proof cover for a general-purpose inverter unit, in which the cover prevents a splash and jet streams of water from coming into the place around a cooling fan disposed in the wind channel in the unit case of the inverter from the surroundings, while maintaining ventilation performance of the cooling fan.

2. Description of the Related Art

FIGS. 6 and 7 show an example of the structure of a general-purpose inverter unit. Referring to the figures, a unit case 1 comprises a front case 2 and a rear case 3. The front case 2 accommodates a circuit section 4 constructed of electronic parts including a power semiconductor module of the main circuit. The rear case 3 contains a cooling fin assembly 5 of the power semiconductor module that is a heat-generating part, and a cooling fan 6 for ventilating cooling air through the cooling fin assembly 5. The reference symbol 2a designates a piping hole opened in the bottom surface of the front case 2 for wiring cables, and the reference numeral 7 designates an operation panel disposed on the front surface of the front case 2.

The front case 2 accommodating the circuit section 4 is a box type housing covered with side wall surfaces and a ceiling wall surface. On the other hand, the rear case 3 has a wind channel structure combined with the back side of the front case 2, and the top and bottom ends of the rear case 3 opened. A cooling fan 6 is disposed on the top of the rear case 3 and, in operation of the inverter unit, ventilates cooling air through the air channel upward in the unit case 1 and vents the air to the environment as indicated by the arrows in FIG. 7.

The inverter unit may be required to have water-proof in certain environmental condition of the installation location. When an inverter unit is installed together with an outdoor machinery, for example, the inverter unit would be subjected to raindrops or water splash from the machinery side. While the electronic circuit components are contained in the box of the front case 2 enclosed with the walls, the rear case 3 installing the cooling fan 6 has an opening for exhausting cooling air at the top thereof. As a result, a water splash and jet streams of water come onto the cooling fan 6, which is electrical equipment. Consequently, any fault may occur in the electrical components of the cooling fan 6.

In order to deal with this problem, a traditional technology employs a water-proof or, weatherproof container (that is optionally provided) to accommodate the inverter unit therein and places the container in the operation site. Patent Document 1 discloses a specific example of such a container that is a box type casing having metal plates surrounding outer periphery and ceiling surface of the unit case and exhaustion openings of drip-proof performance in the upper side surfaces.

[Patent Document 1] Japanese Unexamined Patent Application Publication No. 2002-151874 (FIG. 1 in particular)

However, the water-proof container composed of metal plates disclosed in Patent Document 1 requires high material costs and manufacturing costs. Moreover, the container needs large external dimensions in order to ensure a sufficient ventilation path within the container for the cooling air exhausted from the unit case of the inverter unit. As a result, a large space is required for installing the inverter unit in such a container.

SUMMARY OF THE INVENTION

It is therefore an object of the present invention to provide a water-proof cover for an inverter unit having an improved construction which employs a cover of a molded resin product with inexpensive manufacturing cost in place of a traditional container comprising metal plates. The water-proof cover has a small-sized and compacted structure eliminating need for large installation space, and ensures high water-proof, drip-proof performance. Also, the water-proof cover efficiently exhausts the cooling air ventilating the unit case of the inverter unit to external environment without deteriorating the ventilation performance of the cooling fan installed in the unit case.

In order to accomplish the above object, the water-proof cover of the invention is suitable for an inverter unit that comprises a front case and a rear case, the front case containing a circuit section including a power semiconductor module and the rear case being a wind channel containing a cooling fin assembly for the power semiconductor module and a cooling fan that ventilates cooling air through the cooling fin assembly in the wind channel and discharges from a top of the unit case. The water-proof cover is a molded resin product that is disposed over the unit case and surrounding the top of the unit case, and forms a ventilating path of the cooling air discharged from the unit case by the cooling fan and an exhausting path downward along side surfaces of the unit case.

In the water-proof cover for an inverter unit as stated above, the water-proof cover comprises an exhausting structure formed at the left and right sides of a front part of the water-proof cover for forming an exhausting path of the cooling air opened downward; and a ventilation guide formed standing around an exhausting port of the cooling fan inside a rear part of the water-proof cover.

The water-proof cover made of resin can be produced by molding with a metal mold, and manufactured at an inexpensive material cost and manufacturing cost, as compared with the conventional container composed of metal plates. The water-proof cover has a small-sized compact structure placed over the top of the unit case and requires substantially no extra space for the cover. In addition, the water-proof cover is provided with the exhausting structure at the both sides thereof opened downward and with a ventilation guide standing up around the exhausting port of the cooling fan to guide the ventilating air toward the exhausting structure. Therefore, the water-proof cover ventilates the cooling air efficiently to the external environment without deteriorating the ventilation performance of the cooling fan disposed in the unit case of the inverter unit, while effectively avoiding entry of scattered water drops and jet streams of water from outside into the interior of the cooling fan.

BRIEF DESCRIPTION OF DRAWINGS

FIGS. 1A and 1B show a structure of a water-proof cover of an embodiment example according to the present invention, wherein FIG. 1A is an exploded perspective view before the cover is combined with the unit case of the inverter unit, and FIG. 1B is an enlarged perspective view of the water-proof cover after combined with the unit case;

FIGS. 2A and 2B illustrates the functions of the water-proof cover of FIGS. 1A and 1B, wherein FIG. 2A shows the water-proof function and FIG. 2B shows ventilating function for cooling air;

FIGS. 4A, 4B, and 4C show the structure of the water-proof cover of FIGS. 1A and 1B, wherein FIG. 4A is a perspective view seen from the bottom, FIG. 4B is a sectional view cut along the line A-A in FIG. 4A, and FIG. 4C is a sectional view cut along the line B-B in FIG. 4A;

DETAILED DESCRIPTION OF THE INVENTION

Figure 6:
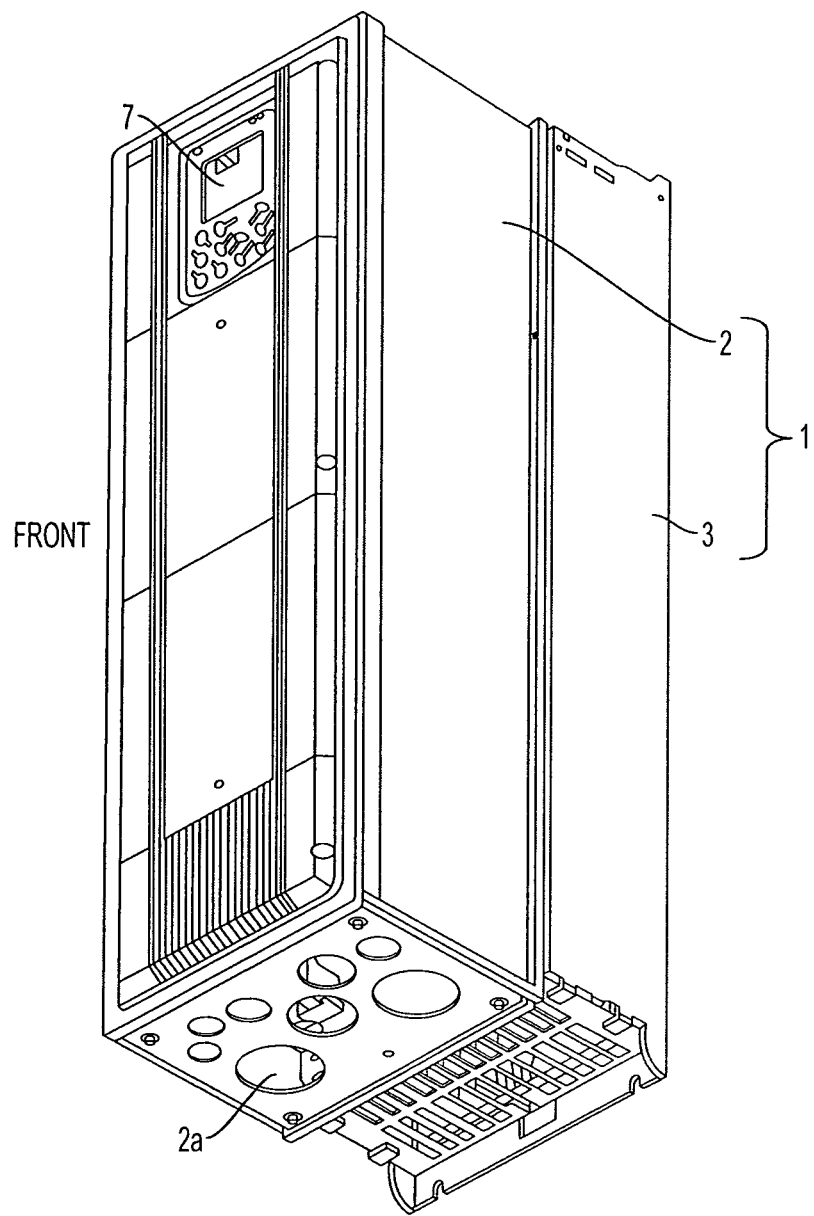
FIG. 6 is an external perspective view of an inverter unit for a general purpose inverter system.
Figure 7:
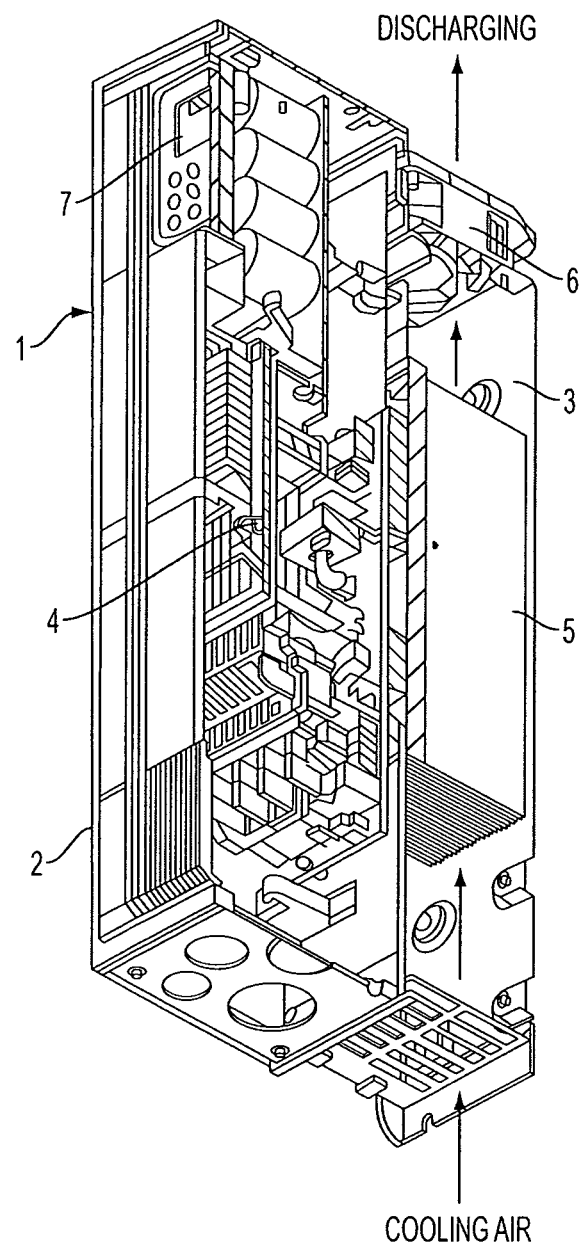
FIG. 7 is a perspective view showing the internal structure of the inverter unit of FIG. 6.

Now, a preferred embodiment according to the present invention will be described in detail in the following with reference to FIGS. 1A through FIG. 5. The members in the embodiment in the figures that are similar to the members in FIGS. 6 and 7, are given the same symbol, and description thereof is omitted.

The water-proof cover can be an optional attachment to an inverter unit according to the water-proof specification in conformity with water-proof protection level 4 or level 5. The water-proof cover 8 made of a molded resin is placed over the top of the unit case 1 and fixed with screws 9 in the embodiment shown in FIG. 1A.

The water-proof cover 8 has a configuration, as shown in FIGS. 4A, 4B, and 4C, with an arch-shaped ceiling and opened bottom and back. The width, a lateral dimension, of the front half of the water-proof cover 8 is a little larger than the width of the unit case 1 to form exhausting paths 8a opened downward at the both sides of the front half of the cover. In the rear half of the cover, a ventilation guide 8b is formed to stand around the exhausting port of the cooling fan 6 disposed at the top of the rear case 3 of the unit case 1 surrounding the exhausting port with three walls of left and right side walls and a back side wall.

Figure 5:
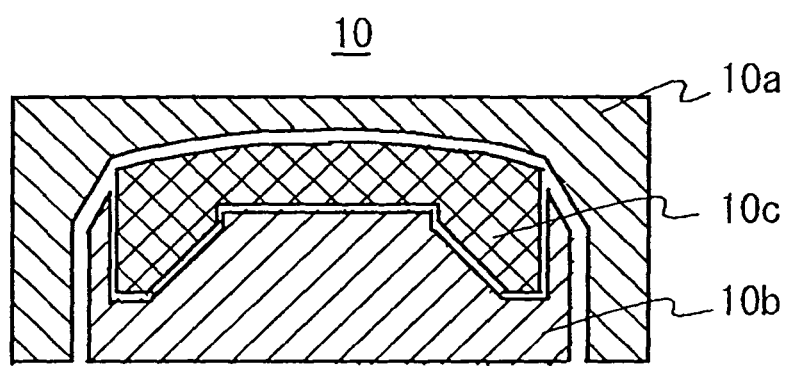
FIG. 5 is a schematic sectional view of a metal mold for fabricating the water-proof cover shown in FIGS. 4A, 4B, and 4C.

The arch-shaped water-proof cover 8 as a mold resin product can be fabricated by a molding process using a metal mold 10 as shown in FIG. 5, comprising a cavity plate 10a, core plate 10b, and a side core 10c, for example.

Figure 1A:
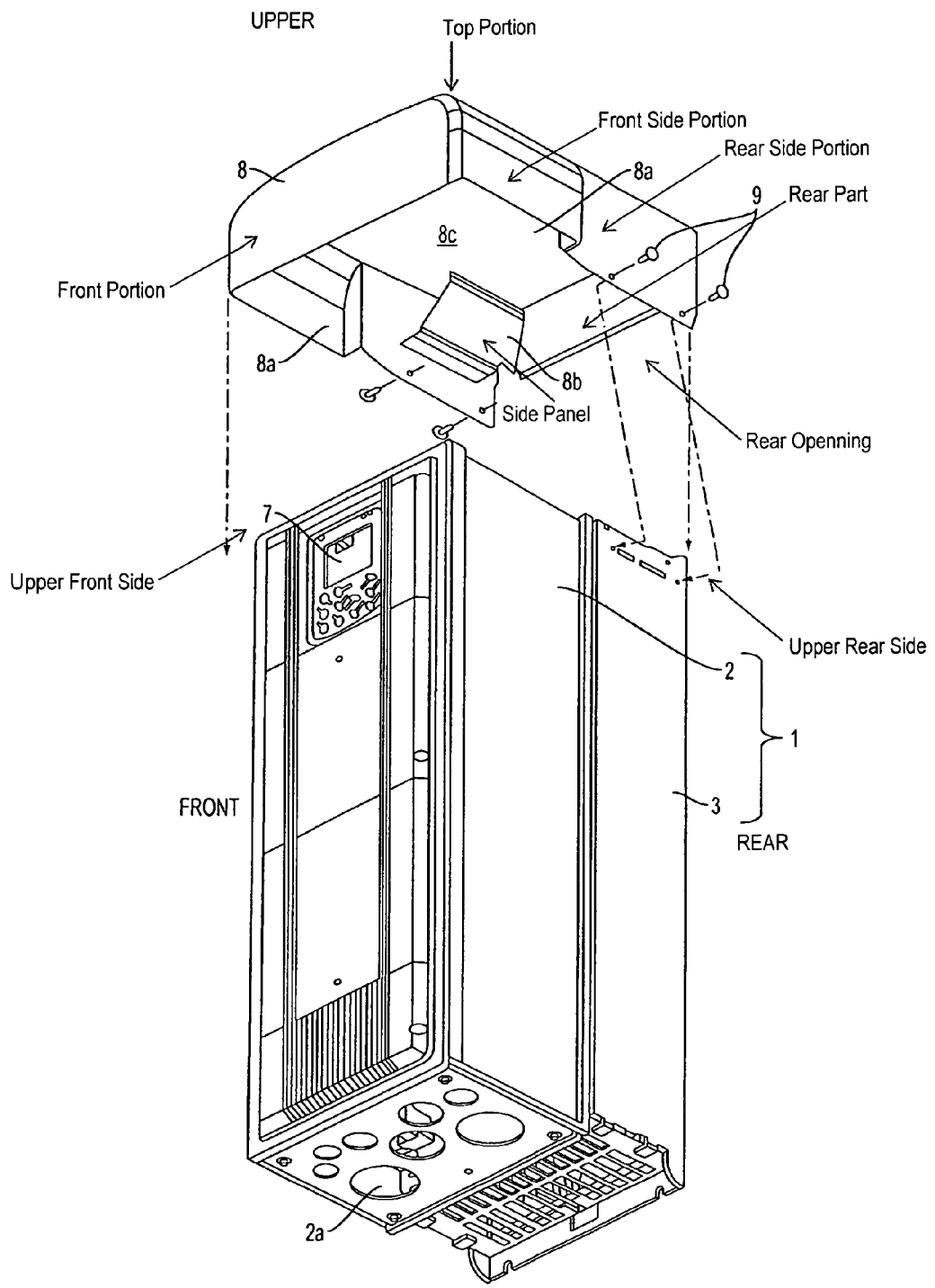
Figure 1B:
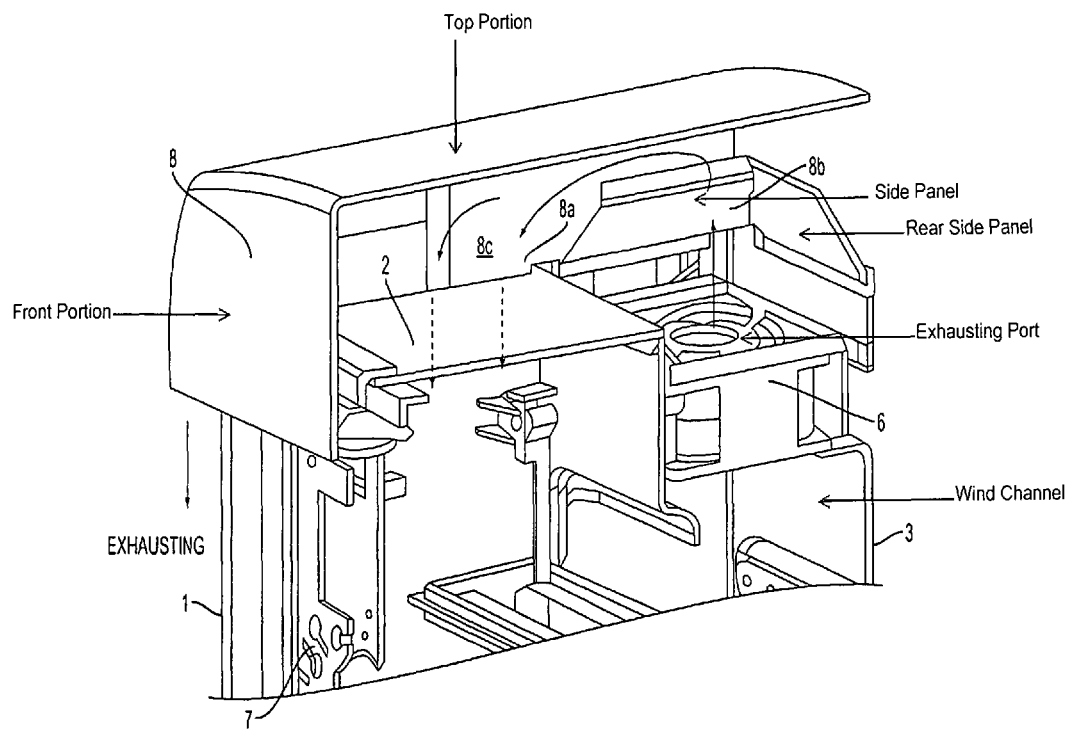
Figure 2B:
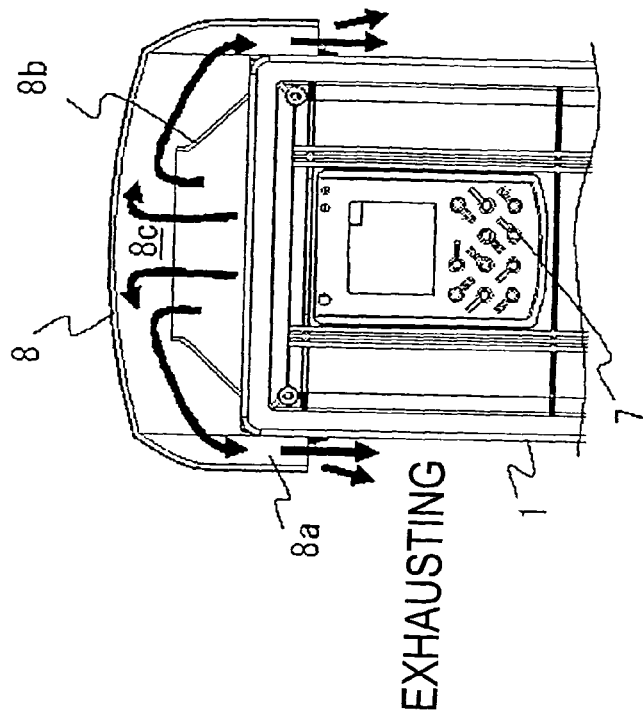

The following describes the water-proof function and the ventilation function of water-proof cover 8 having the structure described above with reference to FIGS. 2A, 2B, and FIG. 3. The water-proof cover 8 covers the ceiling surface and the top peripheral region of the unit case 1 after attaching the cover to the top of the unit case 1 and surrounding the top region of the unit case 1. As shown in FIG. 2B, the water-proof cover 8 has exhausting structures at both sides of the front part of the cover to form exhausting path 8a opened downward along the side surfaces of the front case 2 of the unit case 1. The water-proof cover 8 also has the ventilation guide 8b that forms a ventilation path 8c inside the water-proof cover 8 between the vent part of the cooling fan 6 provided at the top of a wind channel in the rear case 3 of the unit case 1 and the exhausting path 8a. (See also FIG. 1B.)

Figure 2A:
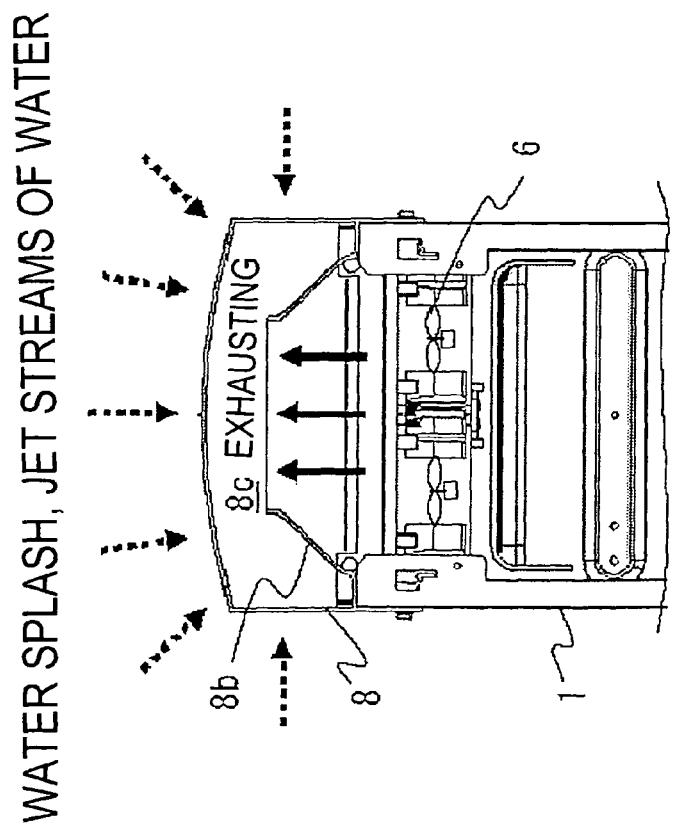

When the inverter unit is installed in an outdoor site and scattered water or jet streams of water fall onto the inverter unit, the water-proof cover 8 shields the unit case 1 to prevent the water from penetrating to the cooling fan 6 disposed at the top region of the rear case 3 as shown in FIG. 2A. Although the water-proof cover 8 is opened at the back, the opening plane is closed with the panel board mounting the inverter unit. Therefore, the rain drops or water splash does not enter directly from the back side of the water-proof cover. Even if water enters through the gap between the plate board and the rear edge of the water-proof cover 8, the ventilation guide 8b works as a cut-off wall obstructing the penetration of water into the cooling fan 6.

Figure 3:
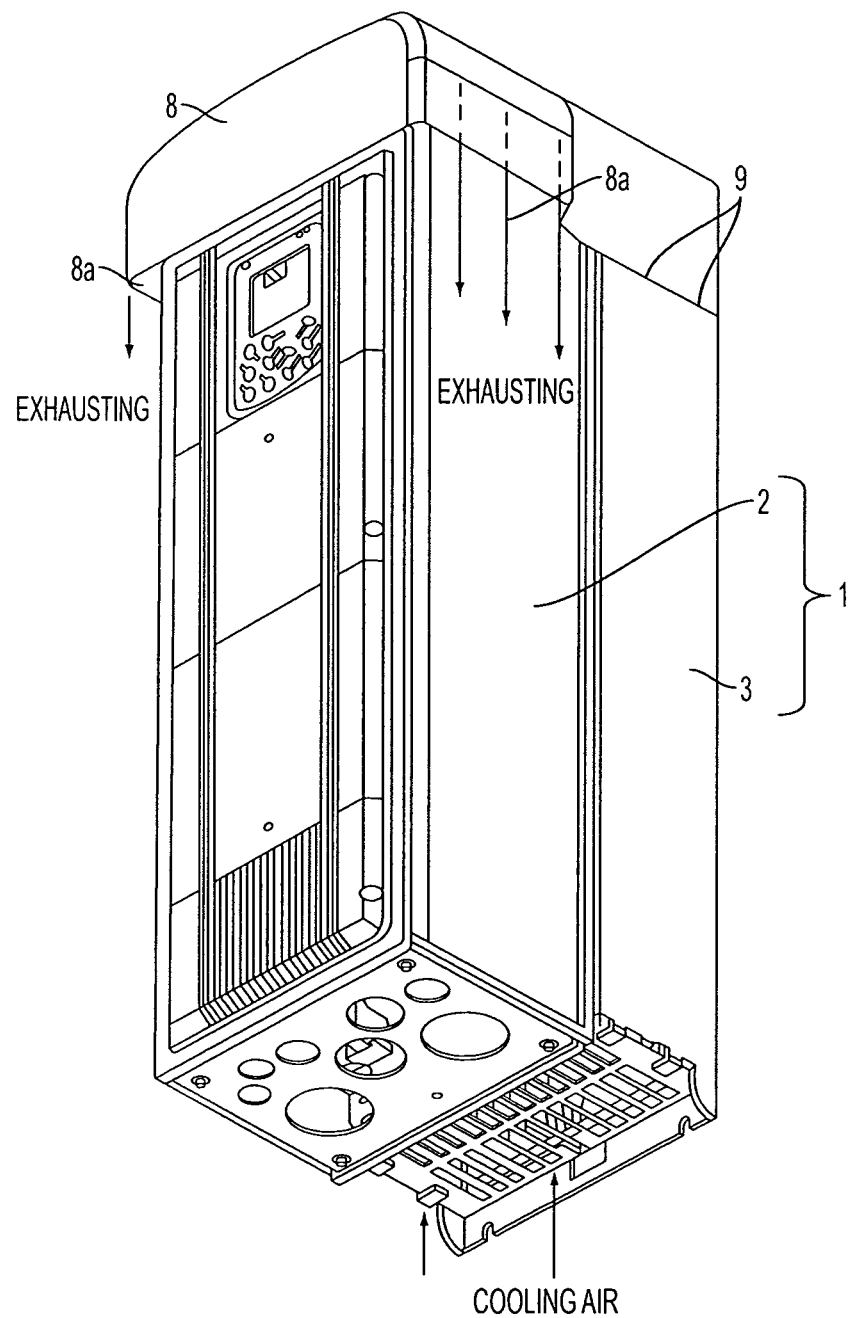
FIG. 3 shows the water-proof cover and the unit case of the inverter combined with the cover as well as an intake and an exhaust of cooling air.

The cooling air taken from the bottom of the rear case 3 as shown in FIG. 3 flows through the wind channel in the rear case 3 and discharged by the cooling fan 6 to the inside space of the water-proof cover 8. The cooling air then flows toward the ventilating path 8c while being guided by a guidance with the ventilation guide 8b along the walls of the guide; thereafter, the cooling air flows along the arch-shaped ceiling of the cover 8 and flows downward in the exhaust path 8a as indicated by the arrows shown in FIG. 1B; and finally exhausted through the openings at the both sides of the front half of the water-proof covers to the external environment.

As described above, the cooling air discharged to the inside space in the water-proof cover 8 by the cooling fan 6, and flows efficiently through the ventilating path 8c and the exhausting path 8a without insignificant draft loss, and then the cooling air is exhausted downward through the openings. The water-proof cover 8 of a resin mold product can be fabricated at a less expensive material cost and manufacturing cost than the conventional container of sheet metal. Moreover, the water-proof cover 8 can be mounted on the unit case 1 of an inverter unit in a small-sized and compacted configuration that needs very small extra space for the cover.

DESCRIPTION OF SYMBOLS

1: unit case
2: front case
3: rear case (or a wind channel)
4: circuit section
5: cooling fin assembly
6: cooling fan
8: water-proof cover
8a: exhausting path
8b: ventilation guide
8c: ventilating path

What is claimed is:
1. A combination comprising:
a unit case for an inverter unit, the unit case having a front case and a rear case, the front case containing a circuit section including a power semiconductor module, and the rear case having a wind channel containing a cooling fin assembly for the power semiconductor module and at least one cooling fan ventilating cooling air through the cooling fin assembly in the wind channel and discharging the cooling air from a top of the unit case; and
a water-proof cover made of a molded resin and disposed over the unit case to surround the top of the unit case, said water-proof cover forming a ventilating path for the cooling air discharged from the unit case and exhausting paths downward along side surfaces of the unit case, wherein the water-proof cover includes:
   a top portion,
   rear side portions extending downwardly from two sides of the top portion to cover upper rear sides of the unit case,
   front side portions extending downwardly from the two sides of the top portion to cover upper front sides of the unit case, the front side portions expanding laterally outwardly from the unit case to form the exhausting paths with respect to the unit case for exhausting the cooling air downward through the exhausting paths,
   a ventilation guide formed at the top portion around an exhausting port of the at least one cooling fan,
   a front portion connecting the front side portions, and spaced from the unit case so that air from the exhausting port is guided by the ventilation guide and ejected downwardly between the front portion and the unit case, and
   a rear opening at a side opposite to the front portion, and
said ventilation guide is spaced from the top portion, and includes two side panels inclining relative to the rear side portions, and a rear side panel inclining toward the front portion.

2. The combination according to claim 1, wherein the water-proof cover includes the ventilation guide formed inside a rear part thereof to surround the exhausting port of the cooling fan.

\* \* \* \* \*